(12) United States Patent
Tada et al.

(10) Patent No.: US 6,224,448 B1
(45) Date of Patent: May 1, 2001

(54) LUMINESCENT DISPLAY DEVICE AND METHOD OF FORMING THE SAME

(75) Inventors: Hiroshi Tada; Koji Utsugi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/534,400

(22) Filed: Mar. 24, 2000

Related U.S. Application Data (62) Division of application No. 09/020,787, filed on Feb. 9, 1998.

(30) Foreign Application Priority Data

Feb. 7, 1997 (JP) .................................... 9-024955

(51) Int. Cl.$^7$ .................................................. H05B 33/14
(52) U.S. Cl. .......................................................... 445/24
(58) Field of Search ................................................ 445/24

(56) References Cited

U.S. PATENT DOCUMENTS 5,294,869 * 3/1994 Tang et al. ........................... 313/504

FOREIGN PATENT DOCUMENTS 5-258859   10/1993   (JP) .

* cited by examiner

Primary Examiner—Kenneth J. Ramsey
(74) Attorney, Agent, or Firm—Young & Thompson

(57) ABSTRACT

An electroluminescent display having top and bottom stripe-shaped electrodes extending in first and second directions perpendicular to each other so that a single electroluminescent organic thin film is sandwiched by the top and bottom electrodes, crossing regions of the top and bottom electrodes being aligned in matrix, and sub-pixels being formed in the crossing regions. Pixels are formed by a plurality of the sub-pixels, and shielding walls are provided at boundaries of the pixels. Shielding walls may also be provided at a boundary between each of the sub-pixels, and at least one sub-pixel in each pixel has a light emission dopant added to a host light-emission layer or region.

8 Claims, 8 Drawing Sheets

LUMINESCENT DISPLAY DEVICE AND METHOD OF FORMING THE SAME

CROSS-REFERENCE TO RELATED APPLICATIONS

This application is a division of application Ser. No. 09/020,787, filed Feb. 9, 1998.

BACKGROUND OF THE INVENTION

The present invention relates to a multicolor electroluminescent display device and a method of forming the same.

The conventional fabrication method is disclosed in Japanese laid-open patent publication No. 5-258859. This method has a problem with complicated fabrication processes.

The other method is disclosed in Asia Display 1995 S11-2. This method has a disadvantage in further providing a fluorescent material region in addition to the organic thin film electroluminescent element and a problem with complicated fabrication processes.

In the above circumstances, it had been required to develop a method of forming an electroluminescent display free from the above problems.

SUMMARY OF THE INVENTION

Accordingly, it is an object of the present invention to provide a novel method of forming an electroluminescent display free from the above problems.

The above and other objects, features and advantages of the present invention will be apparent from the following descriptions.

The present invention also provides an electroluminescent display having top and bottom stripe-shaped electrodes which extend in first and second directions perpendicular to each other so that at least a single electroluminescent organic thin film is sandwiched by the top and bottom electrodes whereby crossing regions of the top and bottom electrodes are aligned in matrix and sub-pixels are formed in the crossing regions, wherein shielding walls are partially provided at a boundary of each of the sub-pixels and wherein at least one sub-pixel involved in the each pixel has a light emission dopant in the emission layer or region.

The present invention also provides an electroluminescent display having top and bottom stripe-shaped electrodes which extend in first and second directions perpendicular to each other so that at least a single electroluminescent organic thin film is sandwiched by the top and bottom electrodes whereby crossing regions of the top and bottom electrodes are aligned in matrix and sub-pixels are formed in the crossing regions, wherein shielding walls are partially provided at a boundary of each of the pixels and wherein at least one sub-pixel involved in the each pixel has a light emission dopant in the emission layer or region.

The present invention also provides an electroluminescent display having top and bottom stripe-shaped electrodes which extend in first and second directions perpendicular to each other so that at least a single electroluminescent organic thin film is sandwiched by the top and bottom electrodes whereby crossing regions of the top and bottom electrodes are aligned in matrix and sub-pixel are formed in the crossing regions, wherein shielding walls are partially provided at a boundary of each of the pixels and also provided at a boundary between one sub-pixel and remaining ones of the sub-pixels and wherein at least one sub-pixel comprising each pixel has a light emission dopant in the emission layer or region.

The present invention also provides a method of forming an electroluminescent display having top and bottom stripe-shaped electrodes which extend in first and second directions perpendicular to each other so that at least a single electroluminescent organic thin film is sandwiched by the top and bottom electrodes whereby crossing regions of the top and bottom electrodes are aligned in matrix and sub-pixels are formed in the crossing regions, wherein said method comprises the steps of: partially providing shielding walls at a boundary of each of the sub-pixels; and depositing a host light emission material and a dopant separately from a different position to form an electroluminescent emission region.

The present invention also provides a method of forming an electroluminescent display having top and bottom stripe-shaped electrodes which extend in first and second directions perpendicular to each other so that at least a single electroluminescent organic thin film is sandwiched by the top and bottom electrodes whereby crossing regions of the top and bottom electrodes are aligned in matrix and sub-pixels are formed in the crossing regions, wherein said method comprises the steps of partially providing shielding walls at a boundary of each of the pixels; and depositing a host light emission material and a dopant separately from a different position to form an electroluminescent emission region.

The present invention also provides a method of forming an electroluminescent display having top and bottom stripe-shaped electrodes which extend in first and second directions perpendicular to each other so that at least a single electroluminescent organic thin film is sandwiched by the top and bottom electrodes whereby crossing regions of the top and bottom electrodes are aligned in matrix and sub-pixels are formed in the crossing regions, wherein said method comprises the steps of partially providing shielding walls at a boundary of each of the pixels and also at a boundary between one sub-pixel and remaining ones of the sub-pixels; and depositing a host light emission material and a dopant separately from a different position to form an electroluminescent emission region.

BRIEF DESCRIPTION OF THE DRAWINGS

Preferred embodiments according to the present invention will be described in detail with reference to the accompanying drawings.

DISCLOSURE OF THE INVENTION

The present invention provides a method of fabricating an electroluminescent display having the following structures.

Top and bottom stripe-shaped electrodes extend in first and second directions perpendicular to each other so that at least a single electroluminescent organic thin film is sandwiched by the top and bottom electrodes. The crossing regions of the top and bottom electrodes are aligned in matrix and sub-pixels are formed in the crossing regions. Shielding walls are partially provided at a boundary of each of the sub-pixels. At least one sub-pixel comprising each pixel has a light emission dopant in the emission layer or region.

The organic thin film is sandwiched between the paired electrodes which are supplied with a voltage to drive the electroluminescent display. Bottom stripe-shaped electrodes are formed over a substrate. A single or multiple layered organic thin film is formed on the bottom electrodes. Top stripe-shaped electrodes are formed over the organic thin film in a direction perpendicular to the direction along which the bottom electrodes extend so that the top and bottom electrodes define crossing regions which are aligned in a matrix form so that any emission pattern can be obtained.

If the organic layer is not patterned, a single color display is obtained. If different light emission layers emitting different color light are formed at different positions, then a multicolor display can be obtained. A pixel is defined to be a constituent element of patterns when a multicolor display is made. In the multicolor display, the pixel comprises a plurality of organic thin film electroluminescent elements emitting predetermined colored light. A sub-pixel is defined to be a constituent element thereof. By changing an intensive ratio between each of the sub-pixels, a color tone can be changed.

To pattern the sub-pixels, it is required to pattern the host organic layer since the color of the emission light from the organic thin film electroluminescent element depends upon the host organic light emission material. In accordance with the present invention, in the formation of the electroluminescent emission region, light emission dopants are provided so as to cause an emission of light of a different color compared to when no dopant is provided. Prior to the formation of the organic layer, shielding walls are provided over the substrate so that parts of the substrate are shielded from the emission dopant. At the same time when the electroluminescent emission region is formed by deposition, light emission dopants are deposited in an oblique direction to the normal of the substrate surface so as to change the color of the emission light from the original color obtained when no dopant is provided. In this manner, multicolor electroluminescent emission regions can be formed.

When two or more color electroluminescent emission regions are concurrently obtained, an emission dopant is further injected in almost the same direction as the injection direction of the host light emission material so as to improve the emission coefficient and/or change the color of the emission light of the portion onto which the host material only is deposited.

It is required that the shielding walls define shadow portions onto which no material is deposited when the deposition is made in an oblique direction, for which reason the shielding walls are required to have a height which is sufficiently higher than the organic layer, for example, by not less than 1 micrometer preferably. If, however the height of the shielding walls is relatively high as compared to the width of the shadow portion, the available direction for deposition is too limited. It is preferable that a ratio of the height of the shielding walls to a pitch thereof be in the range of 0.2 to 5.

The shielding walls may be made of highly insulative materials which are allowed to be in the form of a thin film. Organic and inorganic materials are available.

The shielding walls may be formed by known methods, for example, patterning by a dry etching using a photo-resist pattern. If the bottom electrodes have been formed before the shielding walls are formed, then it is necessary to prevent the deterioration of the bottom electrode by the patterning of the shielding walls.

To simplify processes, the photo-resist material is used for the shielding walls. The photo-resist film is formed by known methods for exposure and partial removal. The photo-resist material may be applied or alternatevly, a film shaped photo-resist may be bonded.

The electroluminescent emission region may be formed by a known method, for example, resistance-heating, ion-plating and molecular beam epitaxy. In the formation of the emission layer, emission dopants are partially doped by partial shielding by the shielding walls, for which reason a degree of vacuum in a chamber is required sufficient to allow a deposition almost free of influence of the scattered evaporated particles.

The organic layers, except in the electroluminescent emission region, may be formed by the known method, for example, resistance-heating, ion-plating and molecular beam epitaxy and further wet processing. A film of a polymer binder into which low molecular compound is dispersed may be used.

As the electroluminescent material, known organic fluorescent materials are available, for example, anthracene system compounds, triphenylbutadiene system compounds, metal complexes of 8-quinolinole, distyrelarylene derivatives, or mixed ligand aluminum chelate.

In the Journal of Applied Physics vol. 65, 1989, 3610, and SID' 1996 14.1 and OME 94-80, it is disclosed that the color of the emission light is changed by doping the emission dopant. By selecting the host material and dopants, various colors of emission light can be obtained. As dopants, coumarin derivatives, dicyano methylenepyran derivatives, perylene dicarbonic acid ester derivatives and quinacridon derivatives are available.

The dopants may be placed into the hole transport layer and electron transport layer. It is disclosed in Japanese Journal of Applied Physics vol. 34, 1995 L824 that rubrene is doped into N,N'-diphenyl-N,N'-bis( 3-methylphynyl)-1,1'-biphenyl-4,4'-diamine, for example.

PREFERRED EMBODIMENTS

First Embodiment

Figure 1:
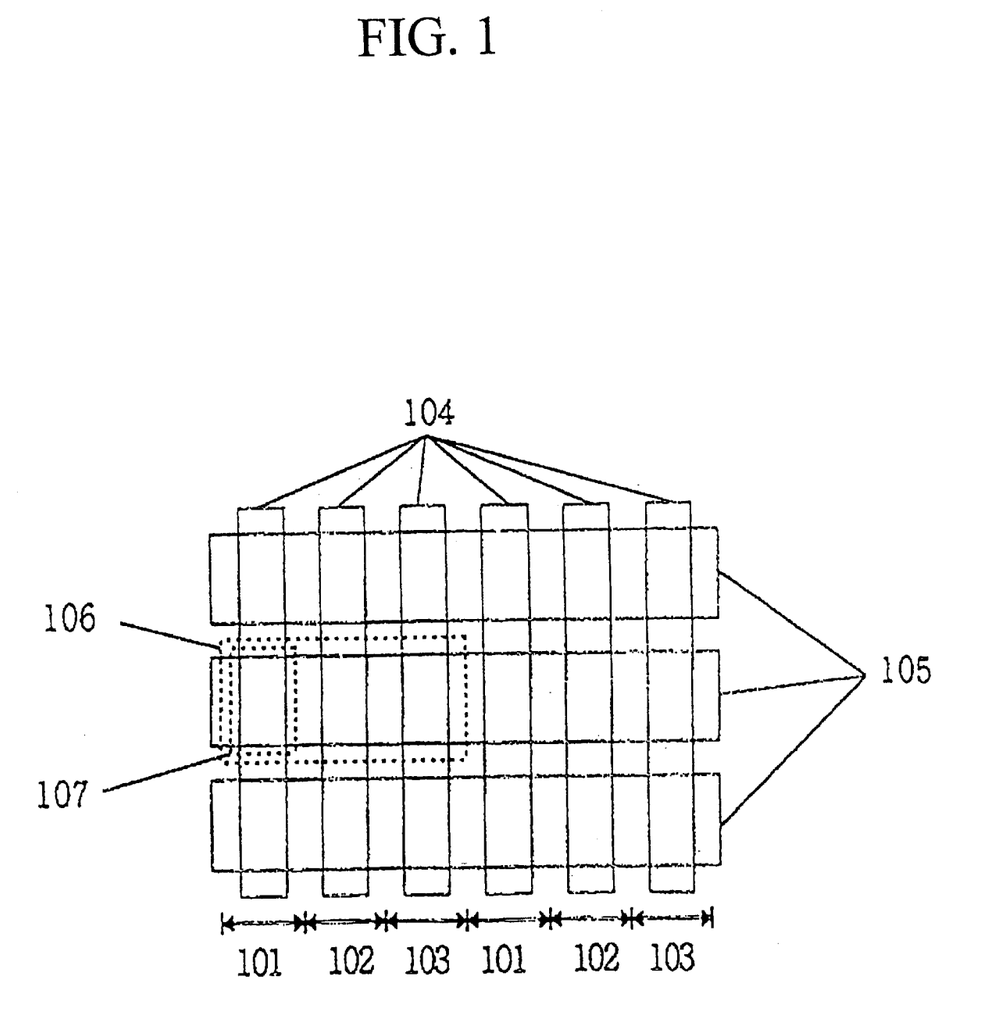
FIG. 1 is a view illustrative of a structure of a pixel in a multicolor organic thin film electroluminescent display device in accordance with the present invention.

A first embodiment according to the present invention will be described in detail as follows wherein a fabrication method for a multicolor organic thin film electroluminescent display device is provided. The multicolor display blue, green and red. FIG. 1 is a view illustrative of a structure of a pixel 106 in a multicolor organic thin film electroluminescent display device in accordance with the present invention. pixels for green, blue and red are provided over a substrate so as to make one set comprising a pixel. Green, blue and red color regions 101, 102 and 103 exist as the organic thin film electroluminescent elements which emit green, blue and red light. The sub-pixels extend in a lateral direction. Bottom electrodes 104 serving as anodes are formed which extend in a vertical direction. Top electrodes 105 serving as cathodes are formed which extend in a lateral direction. The organic thin film electroluminescent elements are formed at crossing positions of the top and bottom electrodes 105 and 104.

Figure 2A:
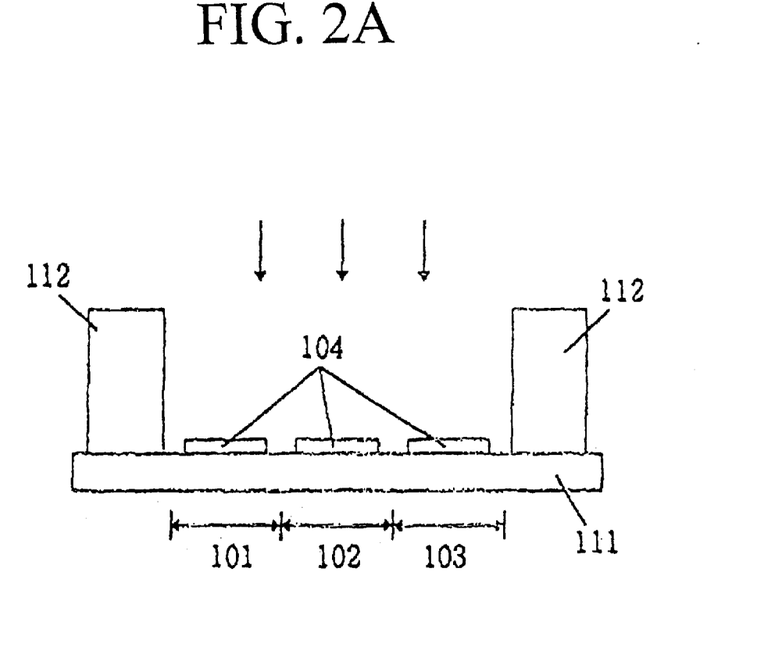
FIGS. 2A through 2D are cross sectional elevation views illustrative of sequential processes for forming a pixel in a multicolor organic thin film electroluminescent display device in a first embodiment in accordance with the present invention.

The fabrication processes for the above organic thin film electroluminescent display will be described. As illustrated in FIG. 2A, Bottom electrodes 104 and shielding walls 112 are formed on an insulating substrate 111.

Figure 2B:
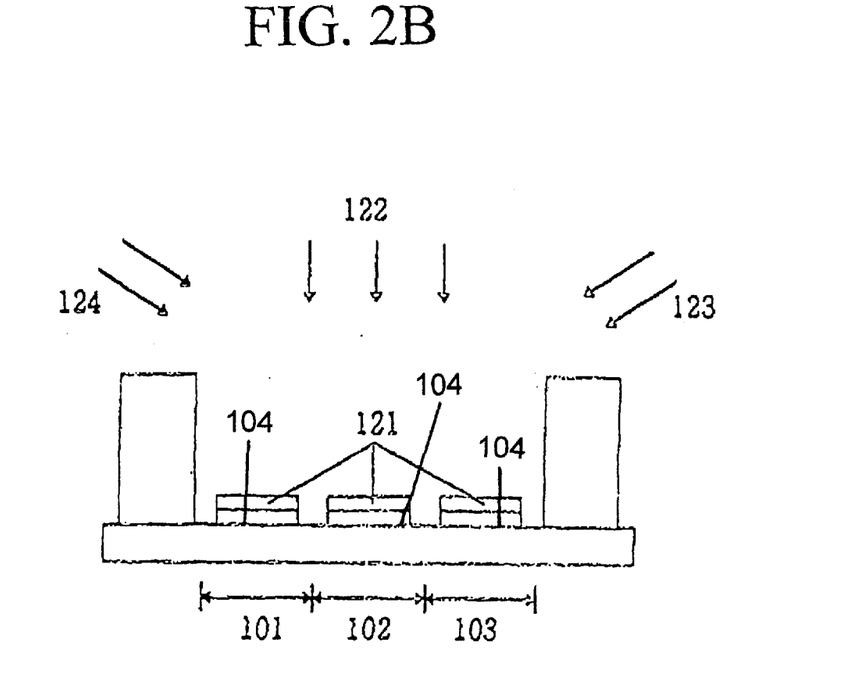

As illustrated in FIG. 2B, hole transport layer 121 are formed on the bottom electrodes 104 by evaporation in a direction shown by the arrow mark of FIG. 2A.

Figure 2C:
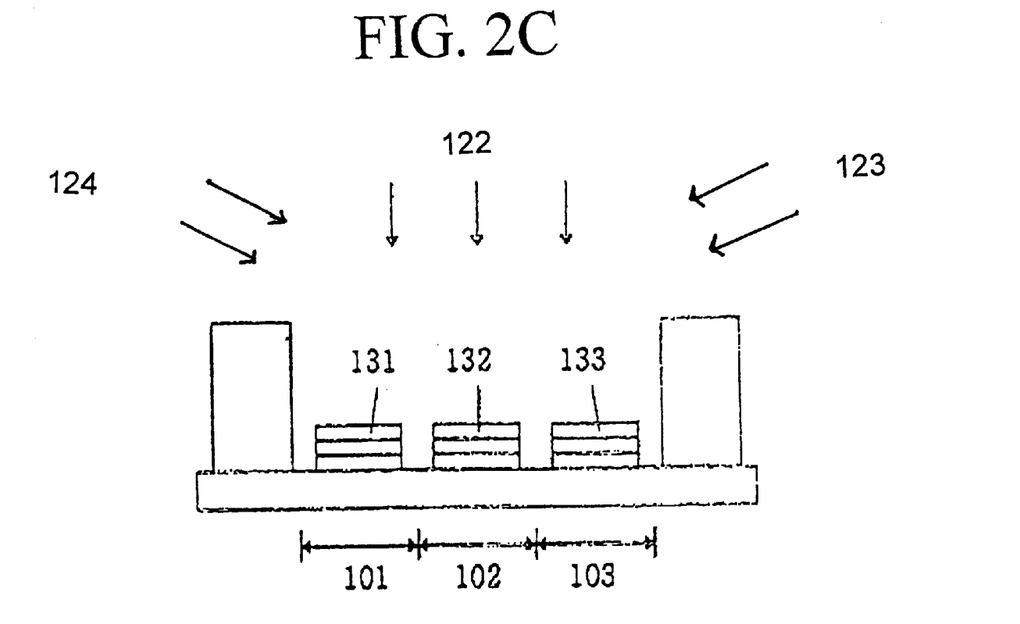

As illustrated in FIG. 2C, a green-light emission layer 131, a blue-light emission layer 132 and a red-light emission layer 133 are concurrently formed. A blue-light emission material is injected in the same direction as a direction shown by the arrow 122 in FIG. 2B to form the emission layer, wherein a small amount of a green-light emission material is also injected in the same direction as shown in the arrow mark 123 so that the green-light emission material is deposited only onto the region 101, whilst a small amount of a red-light emission material is also injected in the same direction as shown in the arrow mark 124 so that the red-light emission material is deposited only onto the region 103. As a result, the blue-light emission layer is formed in the region 102. An emission layer of the blue-light emission host doped with a green-light emission dopant is formed on the region 101. An emission layer of the blue-light emission host doped with a red-light emission dopant is formed on the region 103. By optionally selecting the blue-light emission material and the green-light emission material, the green-light emission electroluminescent layer can be obtained on the region 101. By optionally selecting the blue-light emission material and the red-light emission material, the red-light emission electroluminescent layer can be obtained on the region 103.

Figure 2D:
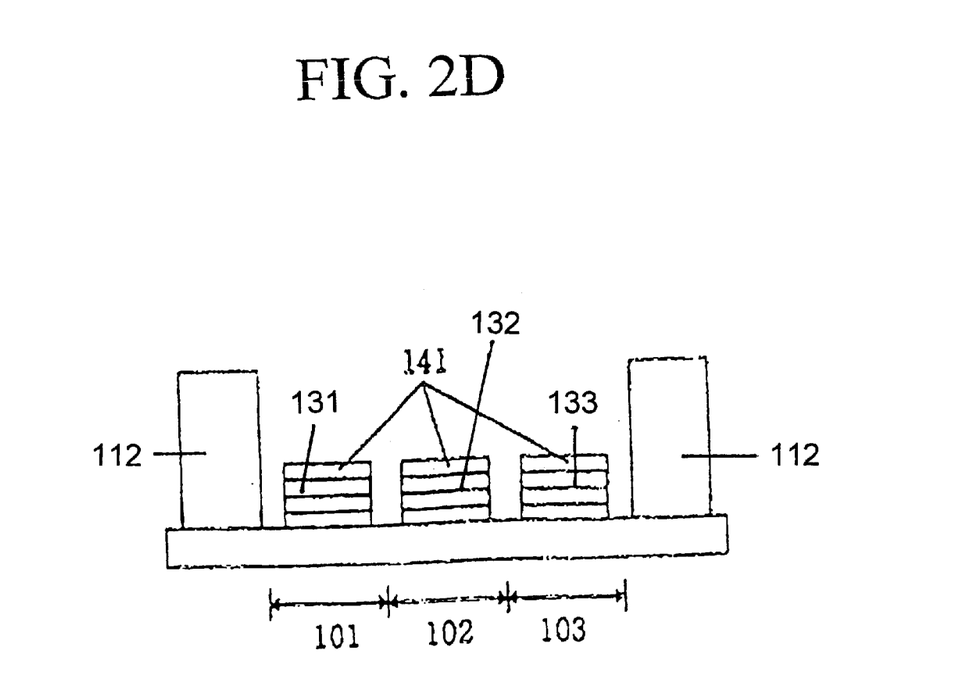

As illustrated in FIG. 2D, electron transport layers 141 are formed on the blue-light emission layer 132, the green-light emission layer 131 and the red-light emission layer 133. The electron transport layers 141 are made by an evaporation or deposition in the same direction as shown in the arrow 122 in FIG. 2C.

A top electrode is then formed in consideration of preventing a disconnection of the top electrode at the shielding walls 112. Thereafter, a deposition of metal in oblique directions may be available so that the metals are deposited on outside walls of the shielding walls 112.

As a result, a three color organic thin film electroluminescent display is fabricated wherein blue-color, green-color and red color sub-pixels are independently controlled in brightness by selecting the top and bottom electrodes.

Second Embodiment

A second embodiment according to the present invention will be described in detail as follows wherein a fabrication method for a multicolor organic thin film electroluminescent display device is provided. The multicolor display comprises blue, green and red. FIG. 1 is a view illustrative of a structure of a pixel 106 in a multicolor organic thin film electroluminescent display device in accordance with the present invention. Sub-pixels for blue, green and red are provided over a substrate so as to make one set of the pixel 106. There exist blue, green and red color regions 101, 102 and 103 for the organic thin film electroluminescent elements which emit blue, green and red light. The sub-pixels extend in a lateral direction. Top electrodes 104 serving as cathodes are formed which extend in a vertical direction. Bottom electrodes 105 serving as anodes are formed which extend in a lateral direction. The organic thin film electroluminescent elements are formed at crossing positions of the top and bottom electrodes 104 and 105.

Figure 3A:
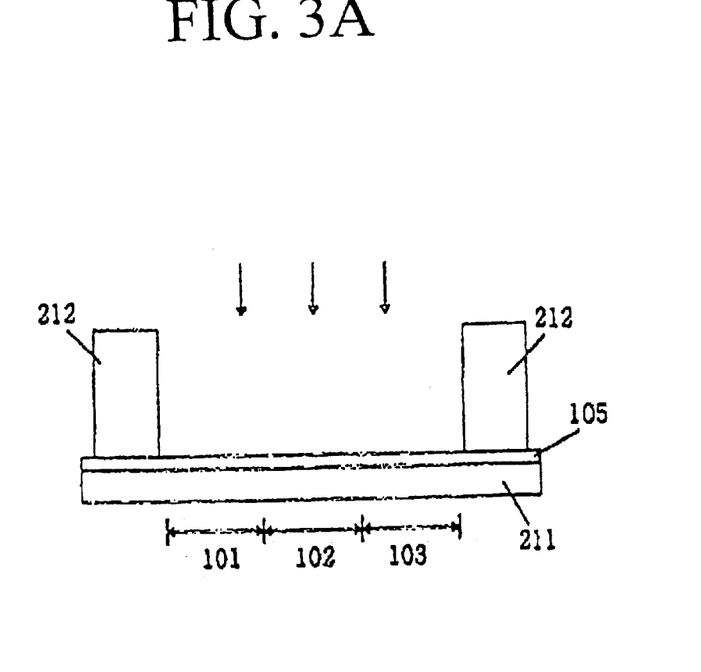
FIGS. 3A through 3F are cross sectional elevation views illustrative of sequential processes for forming a pixel in a multicolor organic thin film electroluminescent display device in a second embodiment in accordance with the present invention.

The fabrication processes for the above organic thin film electroluminescent display will be described. As illustrated in FIG. 3A, a bottom electrode 105 and shielding walls 212 are formed on an insulating substrate 211.

Figure 3B:
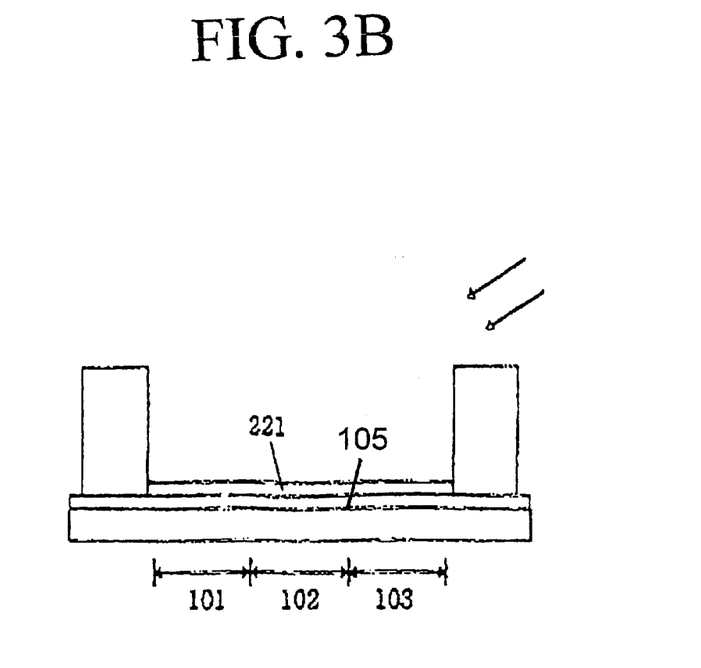

As illustrated in FIG. 3B, hole transport layers 221 are formed on the bottom electrodes 105 by evaporation in a direction as shown by arrow mark of FIG. 3A.

Figure 3C:
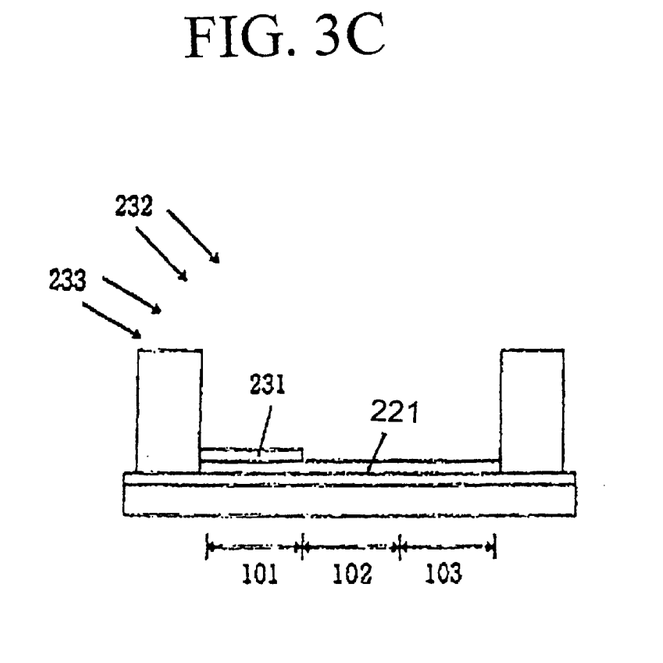

As illustrated in FIG. 3C, a blue-light emission layer 231 is formed over the hole transport layers 221 but only in a region 101 by an injection of a blue-light emission material in a direction as shown by arrow mark in FIG. 3B.

Figure 3D:
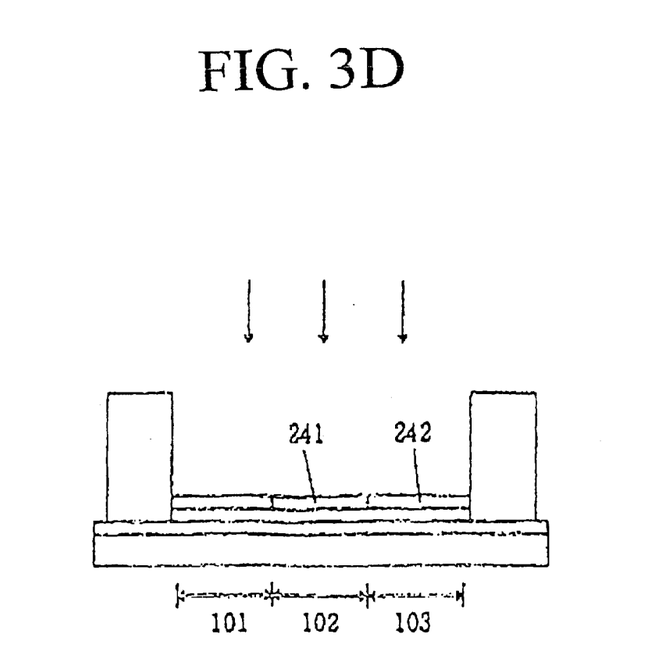

As illustrated in FIG. 3D, a green-light emission material and a red-light emission material are concurrently deposited over the hole transport layers 221 but only regions 102 and 103 respectively whereby a green-light emission layer 241 and a red-light emission layer 242 are selectively and concurrently formed on the regions 102 and 103 respectively. A green-light emission material is injected in a direction of arrow marks 232 in FIG. 3C to form the emission layer, wherein a small amount of a red-light emission material is also injected in the same direction as shown in the arrow mark 233 in FIG. 3C so that the red-light emission material is deposited only onto the region 103. As a result, the blue-light emission layer is formed in the region 101 and the green-light emission layer is formed in the region 102. An emission layer of the green-light emission host doped with a red-light emission dopant is formed on the region 103. By optionally selecting the green-light emission material and the red-light emission material, the red-light emission electroluminescent layer can be obtained on the region 103.

Figure 3E:
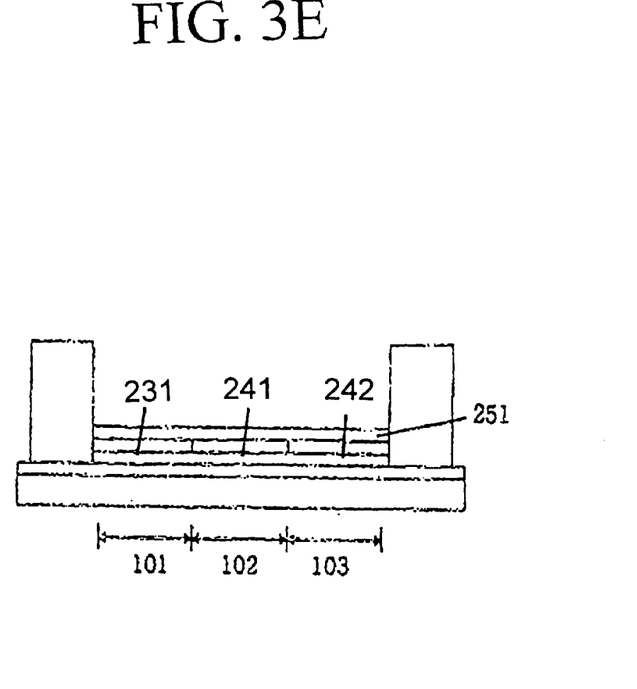
Figure 3F:
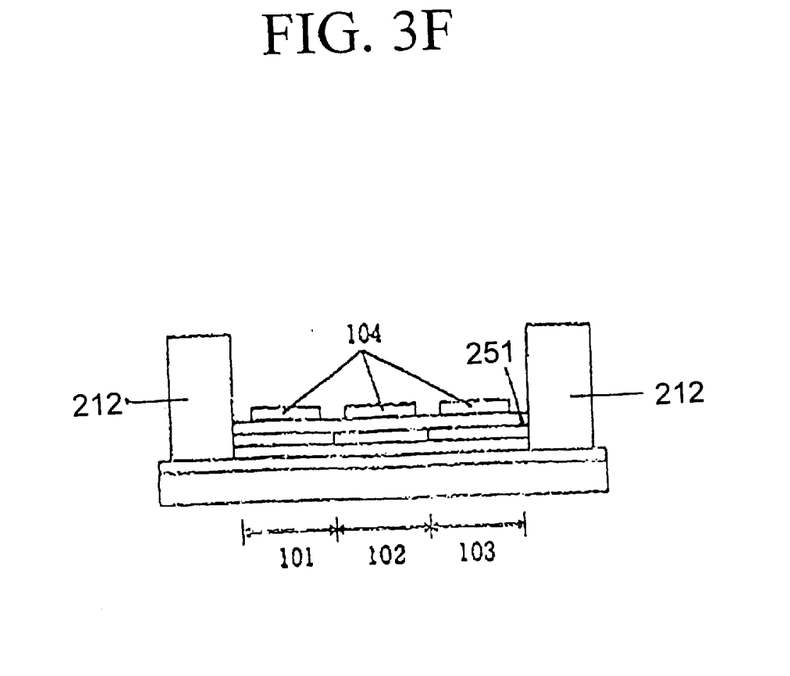

As illustrated in FIG. 3E, an electron transport layers 251 are formed over the blue-light emission layer 231, the green-light emission layer 241 and the red-light emission layer 242. The electron transport layer 251 is made by an evaporation or deposition in the same direction as shown in the arrow mark of FIG. 3D. As illustrated in FIG. 3F, stripe-shaped top electrodes 104 are then formed over the electron transport layers 251. The top electrodes 104 may be formed by patterning by use of a shadow mask. Alternatively, the top electrodes 104 may also be formed by providing lower shielding walls than the shielding walls 212 at boundaries between the regions 101 and 102 and between the regions 102 and 103 and subsequent metal deposition in an oblique direction.

Third Embodiment

A third embodiment according to the present invention will be described in detail as follows wherein a fabrication method for a multicolor organic thin film electroluminescent display device is provided. The multicolor display blue, green and red. FIG. 1 is a view illustrative of a structure of a pixel in a multicolor organic thin film electroluminescent display device in accordance with the present invention. Sub-pixels for blue, green and red are provided over a substrate so as to make one set of the pixel. There exist blue, green and red color regions 101, 102 and 103 for the organic thin film electroluminescent elements which emit blue, green and red light. The sub-pixels extend in a lateral direction. Bottom electrodes 104 serving as anodes are formed which extend in a vertical direction. Top electrodes 105 serving as cathodes are formed which extend in a lateral direction. The organic thin film electroluminescent elements are formed at crossing positions of the top and bottom electrodes 105 and 104.

Figure 4A:
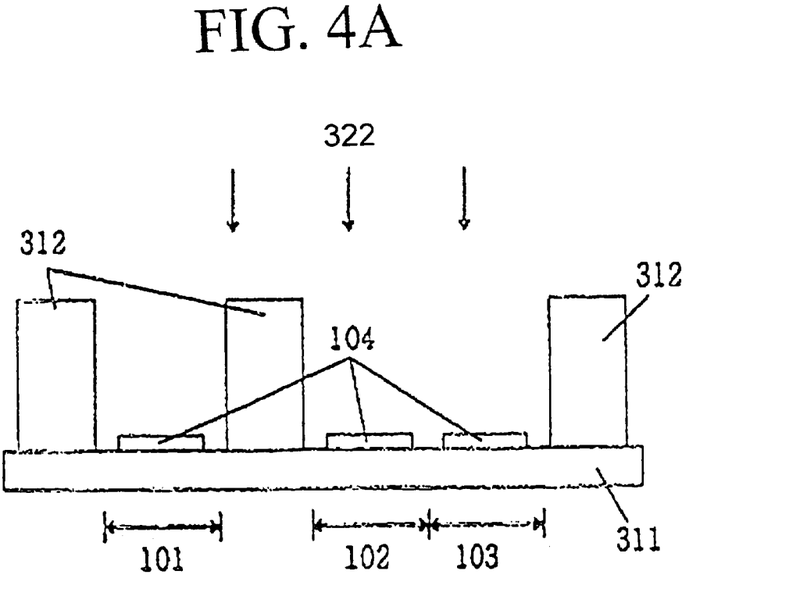
FIGS. 4A through 4D are cross sectional elevation views illustrative of sequential processes for forming a pixel in a multicolor organic thin film electroluminescent display device in a third embodiment in accordance with the present invention.

The fabrication processes for the above organic thin film electroluminescent display will be described. As illustrated in FIG. 4A, Bottom electrodes 104 and shielding walls 312 are formed on an insulating substrate 311.

Figure 4B:
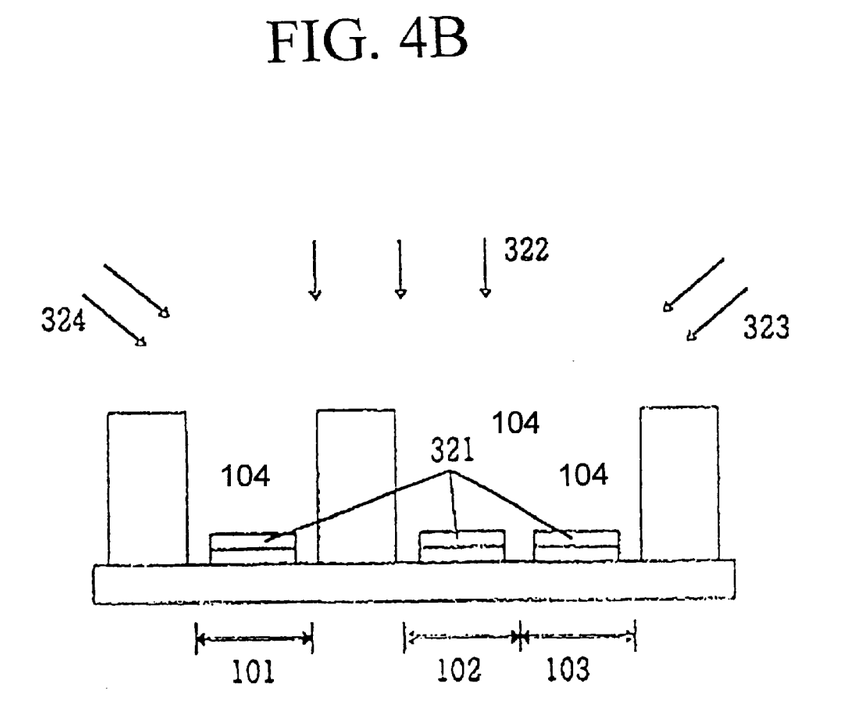

As illustrated in FIG. 4B, hole transport layers 321 are formed on the bottom electrodes 104 by evaporation in a direction shown by an arrow mark of FIG. 4A.

Figure 4C:
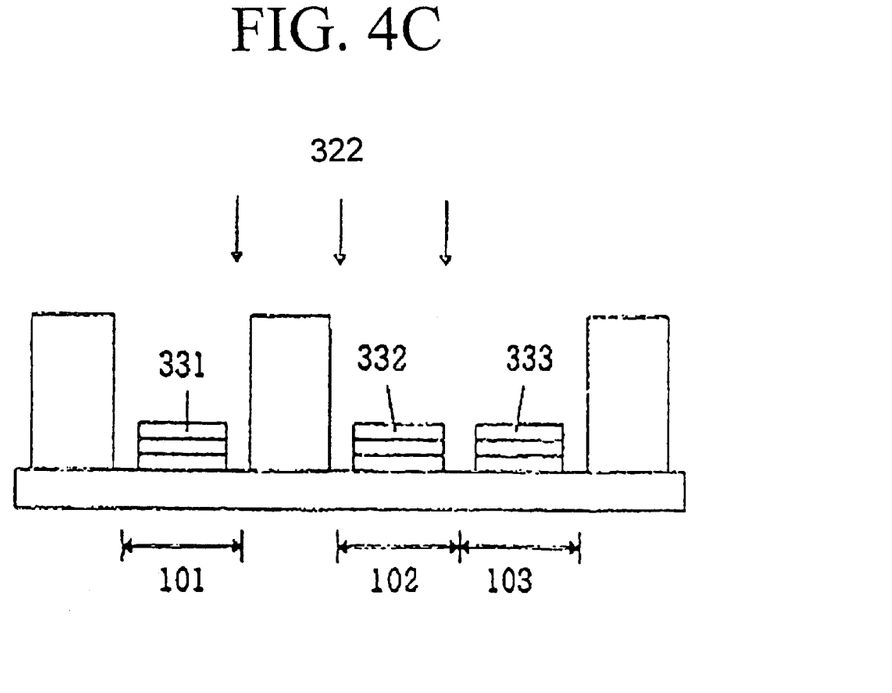

As illustrated in FIG. 4C, a blue-light emission layer 331, a green-light emission layer 332 and a red-light emission layer 333 are concurrently formed. A blue-light emission material is injected in a direction of arrow mark 322 to form the emission layer, wherein a small amount of a green-light emission material is also injected in the same direction as shown in the arrow mark 323 in FIG. 4B so that the green-light emission material is deposited only onto the region 102, whilst a small amount of a red-light emission material is also injected in the same direction as shown in the arrow mark 324 in FIG. 4B so that the red-light emission material is deposited only onto the region 103. As a result, the blue-light emission layer 331 is formed in the region 101. A green-light emission layer 332 of the blue-light emission host doped with a green-light emission dopant is formed on the region 102. A red-light emission layer 333 of the blue-light emission host doped with a red-light emission dopant is formed on the region 103. By optionally selecting the blue-light emission material and the green-light emission material, the green-light emission electroluminescent layer can be obtained on the region 102. By optionally selecting the blue-light emission material and the red-light emission material, the red-light emission electroluminescent layer can be obtained on the region 103.

Figure 4D:
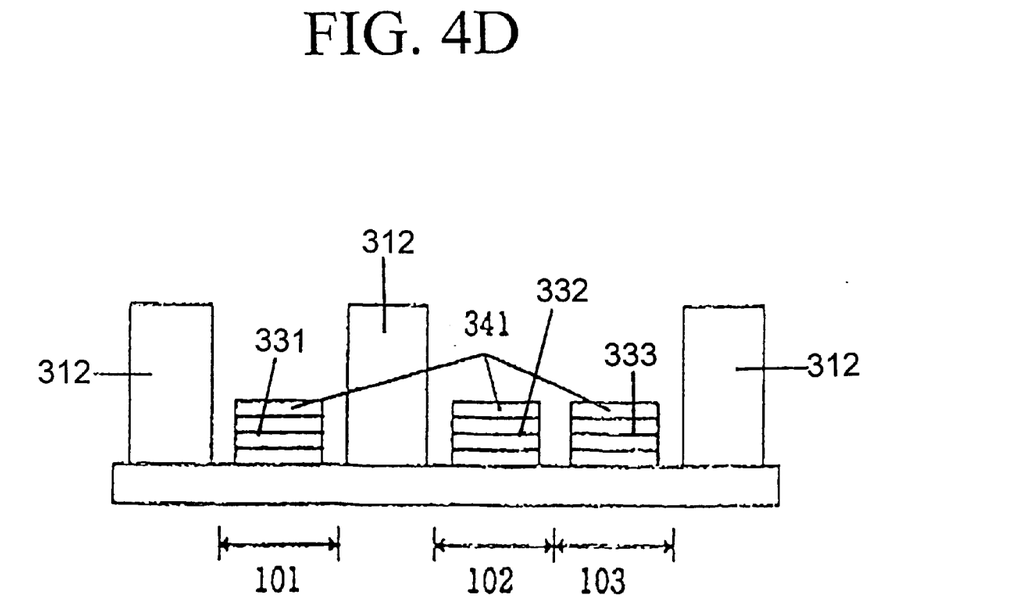

As illustrated in FIG. 4D, electron transport layers 341 are formed on the blue-light emission layer 331, the green-light emission layer 332 and the red-light emission layer 333. The electron transport layers 341 are made by an evaporation or deposition in the same direction as shown in the arrow mark 322 in FIG. 4C.

A top electrode is then formed in consideration of preventing a disconnection of the top electrode at the shielding walls 312. Thereafter, a deposition of metal in oblique directions may be available so that the metals are deposited on outside walls of the shielding walls 312.

As a result, a three color organic thin film electroluminescent display is fabricated wherein blue-color, green-color and red color sub-pixels are independently controlled in brightness by selecting the top and bottom electrodes.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming an electroluminescent (EL) display having top and bottom stripe-shaped electrodes which are aligned in matrix and extend perpendicular to each other to sandwich a single EL organic thin film between the top and bottom electrodes in crossing regions of the top and bottom electrodes to define sub-pixels, wherein a pixel includes a plurality of sub-pixels, the method comprising the steps of:

providing shielding walls so that each pixel is interposed between an adjacent two of the shielding walls;

depositing a host light emission material in a first direction onto a first area of each pixel; and concurrently depositing a first dopant in a second direction different from the first direction onto a second area of each pixel different from the first area of each pixel, wherein the sub-pixels of each pixel emit light of different colors from one another.

2. The method of claim 1, wherein the first direction is perpendicular to a substrate of the EL display to deposit the host light emission material onto all of the sub-pixels, and the second direction is an oblique direction with respect to the substrate to deposit the first dopant onto part of the sub-pixels.

3. The method of claim 1, wherein the first direction is a first oblique direction with respect to a substrate of the EL display to deposit the host light emission material onto a first part of the sub-pixels, and the second direction is a second oblique direction different from the first oblique direction to deposit the first dopant onto a second part of the sub-pixels included in the first part.

4. The method of claim 1, further comprising depositing a second dopant in a direction different from the first and second directions, and wherein three sub-pixels are included in each pixel.

5. A method of forming an electroluminescent (EL) display having top and bottom stripe-shaped electrodes which are aligned in matrix and extend perpendicular to each other to sandwich a single EL organic thin film between the top and bottom electrodes in crossing regions of the top and bottom electrodes to define sub-pixels, wherein a pixel includes three sub-pixels, the method comprising the steps of:

providing shielding walls so that three sub-pixels for each pixel are interposed between an adjacent two of the shielding walls; and depositing a host light emission material in a first direction onto a first area of each pixel having the three sub-pixels and concurrently depositing a first dopant in a second direction different from the first direction onto a second area included in the first area of each pixel, and wherein the sub-pixels of each pixel emit light of different colors from one another.

6. The method of claim 5, wherein said first direction is a first oblique direction with respect to a substrate of the EL display to deposit the host light emission material onto two of the three sub-pixels, and the second direction is a second oblique direction different from the first oblique direction to deposit the first dopant onto one of the two sub-pixels on which the host light emission material is deposited.

7. The method of claim 5, further comprising depositing a second dopant in a third direction different from the first and second directions, wherein the first direction is perpendicular to a substrate of the EL display to deposit the host light emission material onto all of the sub-pixels, and the second and third directions are different oblique directions to deposit the first and second dopants, respectively, onto first and second parts of the sub-pixels.

8. A method of forming an electroluminescent (EL) display having top and bottom stripe-shaped electrodes which are aligned in matrix and extend perpendicular to each other to sandwich a single EL organic thin film between the top and bottom electrodes in crossing regions of the top and bottom electrodes to define sub-pixels, wherein a pixel includes three sub-pixels, the method comprising the steps of:

providing shielding walls so that one of the three sub-pixels for each pixel is interposed between a first set of two adjacent shielding walls and the remaining two of the three sub-pixels are interposed between a second set of two adjacent shielding walls; and depositing a host light emission material in a first direction perpendicular to a substrate of the EL display onto the three sub-pixels and concurrently depositing at least two dopants in first and second oblique directions different from each other onto first and second ones of the remaining two sub-pixels, respectively, so that the three sub-pixels of each pixel emit light of different colors from one another.

* * * * *